(12) United States Patent
Chuang

(10) Patent No.: US 11,444,180 B2
(45) Date of Patent: Sep. 13, 2022

(54) METHOD OF FORMING UNIFORM FIN FEATURES

(71) Applicant: NANYA TECHNOLOGY CORPORATION, New Taipei (TW)

(72) Inventor: Ying-Cheng Chuang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 187 days.

(21) Appl. No.: 16/988,712

(22) Filed: Aug. 9, 2020

(65) Prior Publication Data

US 2022/0045197 A1 Feb. 10, 2022

(51) Int. Cl.
*H01L 29/66* (2006.01)
*H01L 21/8234* (2006.01)

(52) U.S. Cl.
CPC .......... *H01L 29/66795* (2013.01); *H01L 21/823431* (2013.01)

(58) Field of Classification Search
CPC .......... H01L 29/66795; H01L 21/823431

USPC .......................................... 438/400
See application file for complete search history.

(56) References Cited

U.S. PATENT DOCUMENTS

| | | | |
|---|---|---|---|
| 2019/0164745 A1* | 5/2019 | Yang | H01L 21/266 |
| 2020/0020782 A1* | 1/2020 | Ching | H01L 21/76224 |
| 2021/0202326 A1* | 7/2021 | Schwarzenbach | H01L 21/823821 |

FOREIGN PATENT DOCUMENTS

CN 109560045 A * 4/2019 ..... H01L 21/823431

* cited by examiner

*Primary Examiner* — Mohammad M Hoque
(74) *Attorney, Agent, or Firm* — CKC & Partners Co., LLC

(57) ABSTRACT

A method for forming a semiconductor structure includes: providing a structure including a substrate and a target layer disposed on the substrate, and the target layer includes a central area and a periphery area; forming a plurality of linear fin features within the central area in which the linear fin features are substantially parallel to each other and include edge imbalance portions; and removing the edge imbalance portions of the linear fin features to obtain linear uniform fin features.

10 Claims, 9 Drawing Sheets

METHOD OF FORMING UNIFORM FIN FEATURES

BACKGROUND

Field of Invention

The present invention relates to a method for forming a semiconductor structure. More particularly, the present invention relates to a method for forming a semiconductor structure without edge imbalance.

Description of Related Art

As the integration density of semiconductor devices increases, the lithographic process requires higher resolution to meet the accuracy requirements of the semiconductor devices. Photo-etching process is typically used to fabricate electronic and optoelectronic devices on a semiconductor substrate. Therefore, the accuracy of patterns is a very important factor in determining the quality of the semiconductor devices.

However, the edge defects such as edge imbalance of patterns mainly are caused by photo loading effect and etch loading effect after photo-etching process. Optical proximity correction (OPC), pre-distorting the patterns on the mask, is usually performed for solving the edge defects. Yet, much time is needed for conducting OPC in the manufacture process.

A more efficient method for forming a pattern without edge imbalance is needed in the application.

SUMMARY

One aspect of the present disclosure is related to a method for forming a semiconductor structure includes: providing a substrate and a target layer disposed on the substrate, and the target layer includes a central area and a periphery area; forming a plurality of linear fin features within the central area in which the linear fin features are substantially parallel to each other and include edge imbalance portions; and removing the edge imbalance portions of the linear fin features to obtain linear uniform fin features.

In some embodiments of the present disclosure, each linear fin feature includes the edge imbalance portion and a uniform portion, and the imbalance portion has a width lager than that of the uniform portion.

In some embodiments of the present disclosure, the method for forming the semiconductor structure includes forming a hard mask between the substrate and the target layer.

In some embodiments of the present disclosure, the target layer includes SiN.

In some embodiments of the present disclosure, the step of forming the linear fin features in the central area includes performing a first litho-etch process to the central area of the target layer.

In some embodiments of the present disclosure, the step of removing the edge imbalance portions of the linear fin features to obtain uniform linear fin features includes: forming a patterned photoresist layer to cover the target layer in which the patterned photoresist layer includes an opening which exposes the edge imbalance portions of the linear fin features; removing the edge imbalance portions; and removing the patterned photoresist layer.

In some embodiments of the present disclosure, the opening has a width (W) ranging from about 100 nm to about 1 µm.

In some embodiments of the present disclosure, the method for forming a semiconductor structure further includes: etching the linear uniform fin features such that each linear uniform fin feature is divided into segment fin features, and abutting two of the segment fin features are spaced apart by a trench.

In some embodiments of the present disclosure, the method for forming a semiconductor structure further includes: growing an isolation structure in the trench; and performing a polish treatment to the isolation structure to expose the segment fin features.

In some embodiments of the present disclosure, the step of etching the linear uniform fin features such that each linear uniform fin feature is divided into segment fin features includes: performing a second litho-etch process to each linear uniform fin feature.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
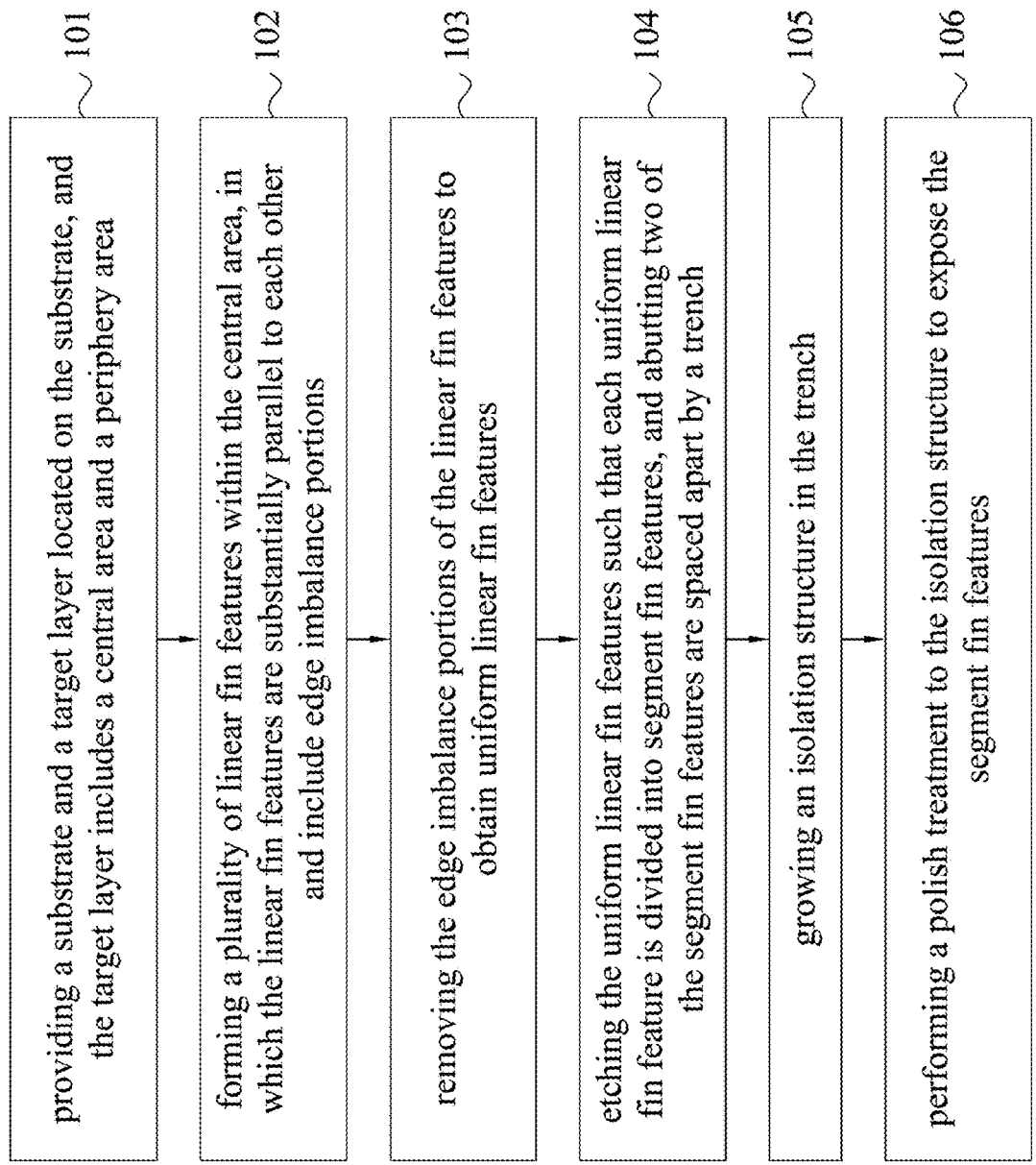
FIG. 1 is a flowchart of a method for fabricating a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the some embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to some embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The terms "comprise," "comprising," "include," "including," "has," "having," etc. used in this specification are open-ended and mean "comprises but not limited."

The present disclosure is directed to a method of forming a pattern. More specifically, the present disclosure is directed to a method for forming a semiconductor structure and avoiding edge imbalance without an OPC processing.

FIG. 1 is a flowchart of a method 100 for fabricating a semiconductor structure in accordance with some embodiments of the present disclosure. The method 100 begins with Step 101 in which providing a substrate and a target layer located on the substrate, and the target layer includes a central area and a periphery area. The method continues with Step 102 in which a plurality of linear fin features are formed within the central area and the linear fin features are substantially parallel to each other and include edge imbalance portions. The method 100 continues with Step 103 in which the edge imbalance portions of the linear fin features are removed to obtain linear uniform fin features. Next, the method 100 continues with Step 104 in which the linear uniform fin features are etched such that each linear uniform fin feature is divided into segment fin features, and abutting two of the segment fin features are spaced apart by a trench. The method 100 continues with Step 105 in which an isolation structure is grown in the trench. Thereafter, the method 100 continues with Step 106 in which a polish treatment is performed to the isolation structure to expose the segment fin features. While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
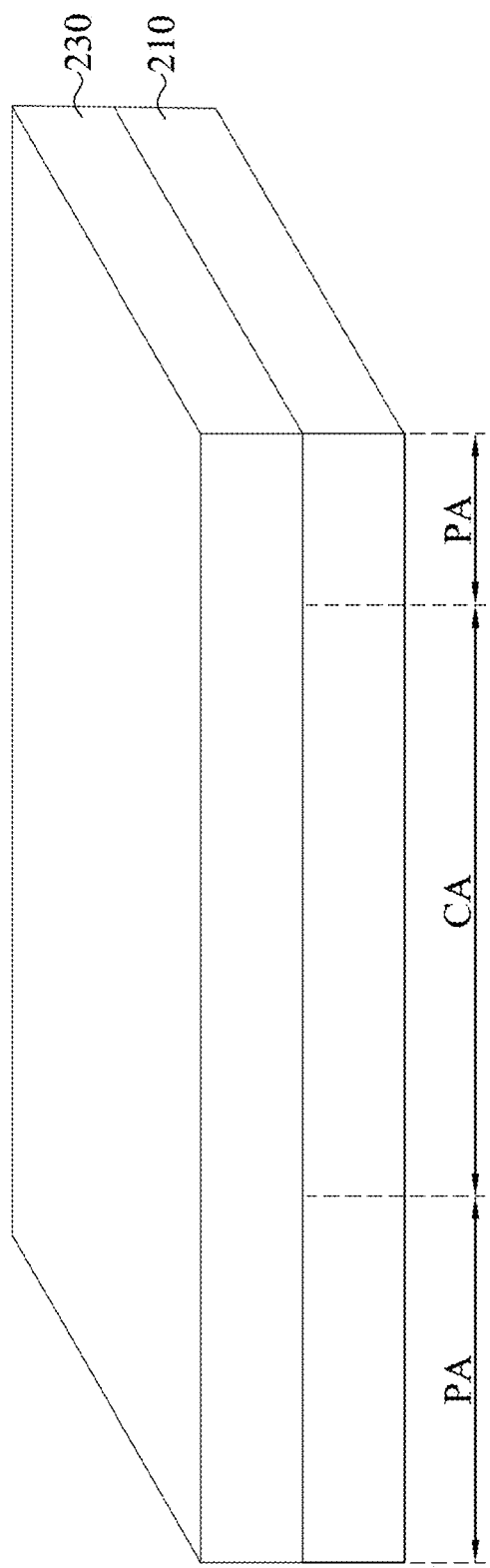
FIG. 2 to FIG. 7 schematically depict a perspective view of a process flow of forming a semiconductor structure in accordance with some embodiments of the present disclosure.

FIG. 2 through FIG. 7 schematically depict perspective views of a process flow of the method 100 for forming a semiconductor structure 200 in accordance with some embodiments of the present disclosure. FIG. 2 illustrates the details about Step 101 in FIG. 1. Referring to FIG. 1 and FIG. 2, a substrate 210 and a target layer 230 are provided in which the target layer 230 is disposed on the substrate 210. The target layer 230 includes a central area CA and a periphery area PA. In some embodiments of the present disclosure, a material of substrate 210 is different from a material of the target layer 230. The substrate 210 includes silicon (Si), gallium (Ga), gallium arsenide (GaAs), gallium nitride (GaN), strained silicon, silicon-germanium (SiGe), silicon carbide (SiC), diamond, epitaxy layer or the combination thereof. The material of the target layer 230 is selected based on the types of devices to be formed. In some embodiments of the present disclosure, the target layer 230 includes dielectric materials (such as SiN), semiconductive materials, or conductive materials. The target layer 230 can be formed on the substrate 210 by using a deposition process such as, for example, chemical vapor deposition (CVD), plasma enhanced chemical vapor deposition (PECVD), physical vapor deposition (PVD), or other suitable deposition processes, and the present disclosure is not limited in this respect.

In some embodiments of the present disclosure, the method 100 further includes a step of forming a hard mask between the substrate 210 and the target layer 230 as an etch stop layer in which the hard mask includes a monolayer structure or a multi-layered structure.

Figure 3:
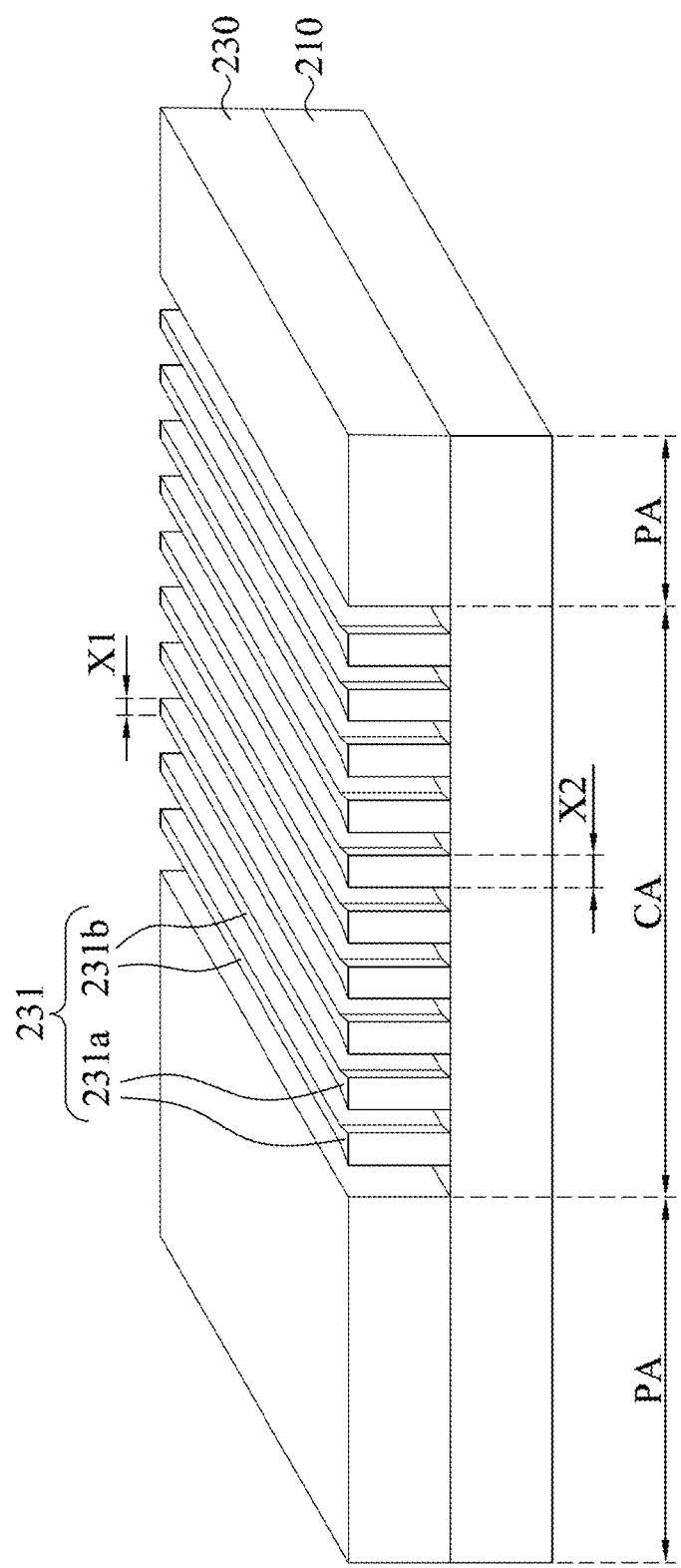

Reference is made to FIG. 2 and FIG. 3. FIG. 2 and FIG. 3 can diagrammatically illustrate Step 102 of FIG. 1. In accordance with some embodiments of the present disclosure, a first litho-etch process is performed to the central area CA of the target layer 230 such that the linear fin features 231 are formed in the central area CA. A litho-etch process refers to using light to transfer a geometric pattern from a photomask to a photosensitive chemical photoresist, and a series of chemical treatments then either etches the exposure pattern into the material or enables deposition of a new material in the desired pattern upon materials underneath the photoresist. Specifically, due to photo loading effect and etch loading effect, the linear fin features 231 include edge imbalance portions 231a and uniform portions 231b in which the edge imbalance portions 231a have widths X1 lager than widths X2 of the uniform portions.

Figure 4:
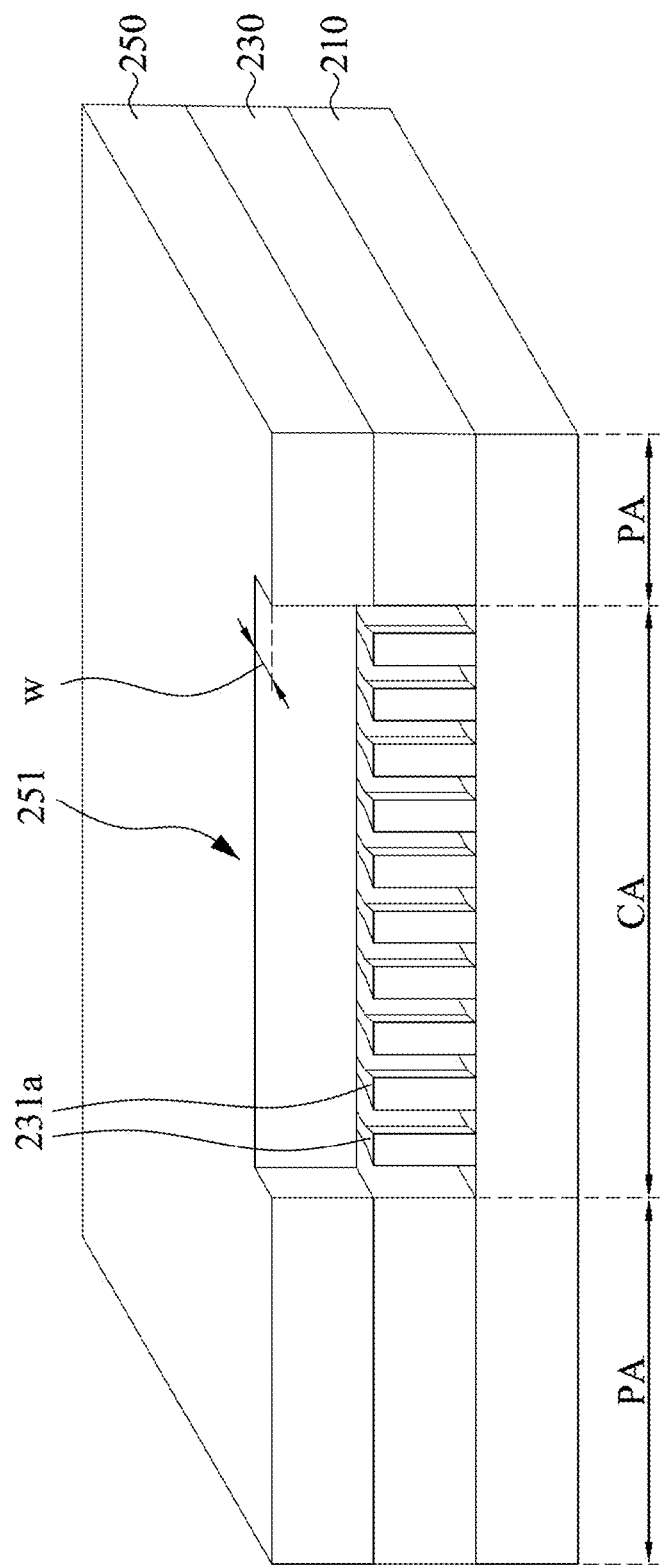
Figure 5:
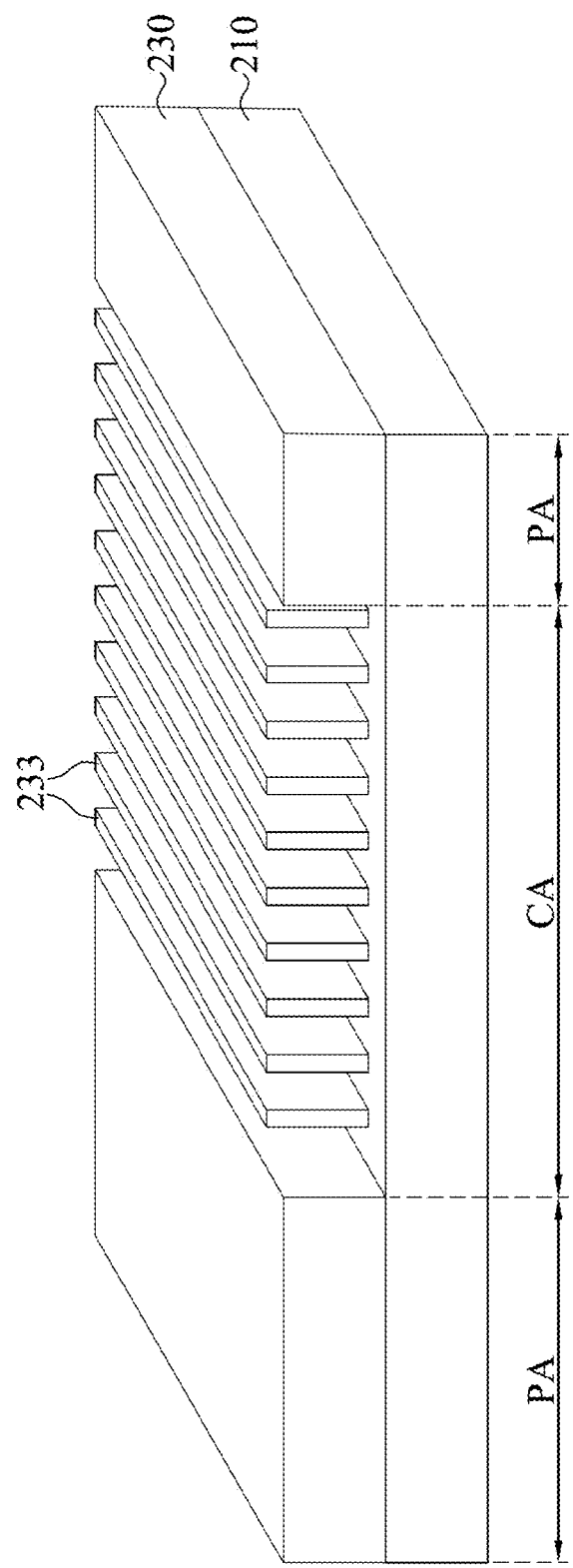

Reference is made to FIG. 3 through FIG. 5. FIG. 3 through FIG. 5 can diagrammatically illustrate Step 103 in FIG. 1. In some embodiments of the present disclosure, Step 103, removing the edge imbalance portions 231a of the linear fin features 231 to obtain linear uniform fin features 233, includes forming a patterned photoresist layer 250 to cover the periphery area PA and the target layer 230 in which the patterned photoresist layer 250 has an opening 251 exposing the edge imbalance portions 231a of the linear fin features 231. Thereafter, the edge imbalance portions 231a are removed, and the patterned photoresist layer 250 is then removed. Since only the uniform portions 231b of the linear fin feature 231 are remained, linear uniform fin features 233 can be obtained.

Specifically, the patterned photoresist layer 250 can be a positive photoresist layer or a negative photoresist layer. A patterned mask (not shown) is applied to cover some regions of the patterned photoresist layer 250 to block light, so that the uncover regions of the patterned photoresist layer 250 will be exposed to the light. A solvent is then applied to the patterned photoresist layer 250 in order to remove the covered regions or the uncovered regions of the patterned photoresist layer 250. In the case of using the positive photoresist layer, the uncovered region of the patterned photoresist layer 250 is degraded and dissolved away. In the case of using the negative photoresist layer, the uncovered region of the patterned photoresist layer 250 is strengthened by the light, and the solvent dissolves the covered region of the patterned photoresist layer 250 away. Through the aforementioned methods, the patterned photoresist layer 250 can be patterned to form the opening 251. Moreover, the opening 251 has a width (W) ranging from about 100 nm to about 1 μm to expose the edge imbalance portions 231a.

In embodiments of the present disclosure, any suitable etch process can be used to remove the edge imbalance portions 231a. Such etch process may be an anisotropic etching process such as a dry etching process or an isotropic etching process such as a wet etching process, and the present disclosure is not limited in this res. On the other hand, any suitable removing process can be used to remove the patterned photoresist layer 250 such as applying an organic solvent or an inorganic solvent to the patterned photoresist layer 250, and the present disclosure is not limited in this respect.

Figure 6:
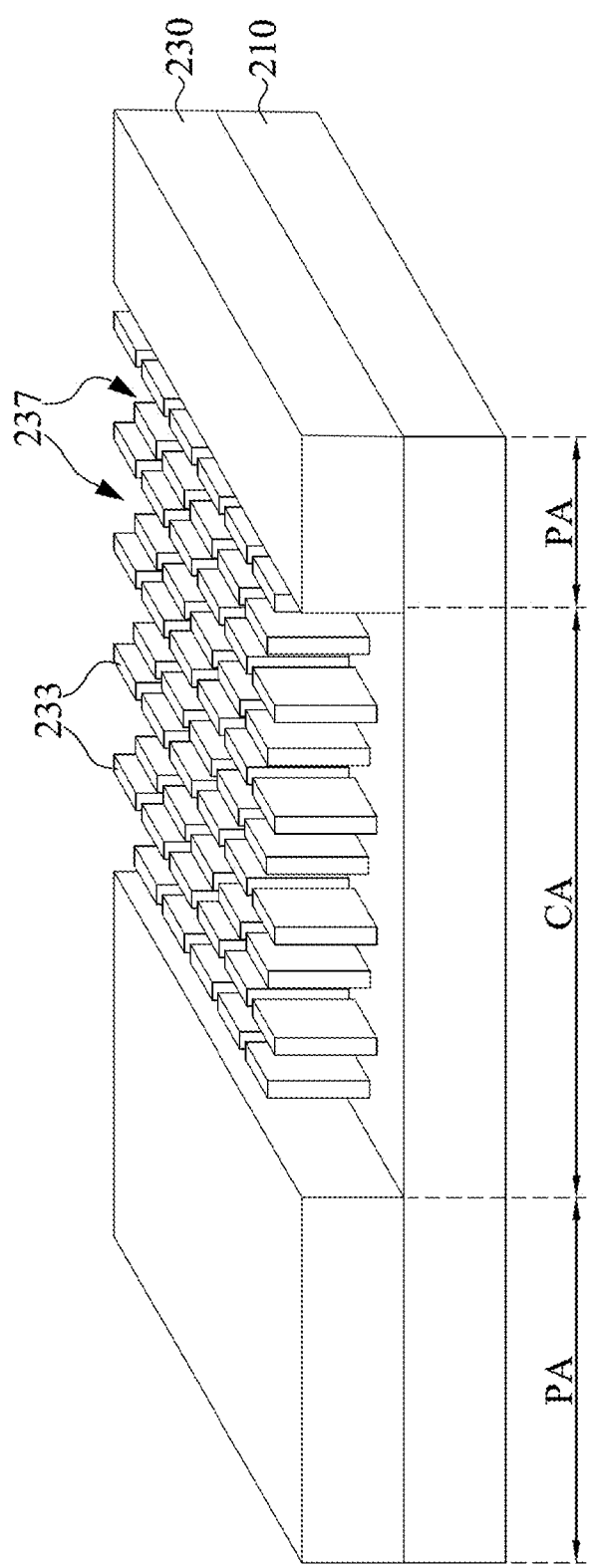

Reference is made to FIG. 5 and FIG. 6. FIG. 5 and FIG. 6 can diagrammatically illustrate Step 104 in FIG. 1. In embodiments of the present disclosure, Step 104 of the method 100 for forming a semiconductor structure further includes: etching the linear uniform fin features 233 such that each of the linear uniform fin features 233 is divided into segment fin features 235, and abutting two of the segment fin features 235 are spaced apart by a trench 237. Specifically, a second litho-etch process is performed to the linear uniform fin features 233 such that the segment fin features 235 are obtained, but the present disclosure is not limited in this respect.

Figure 7:
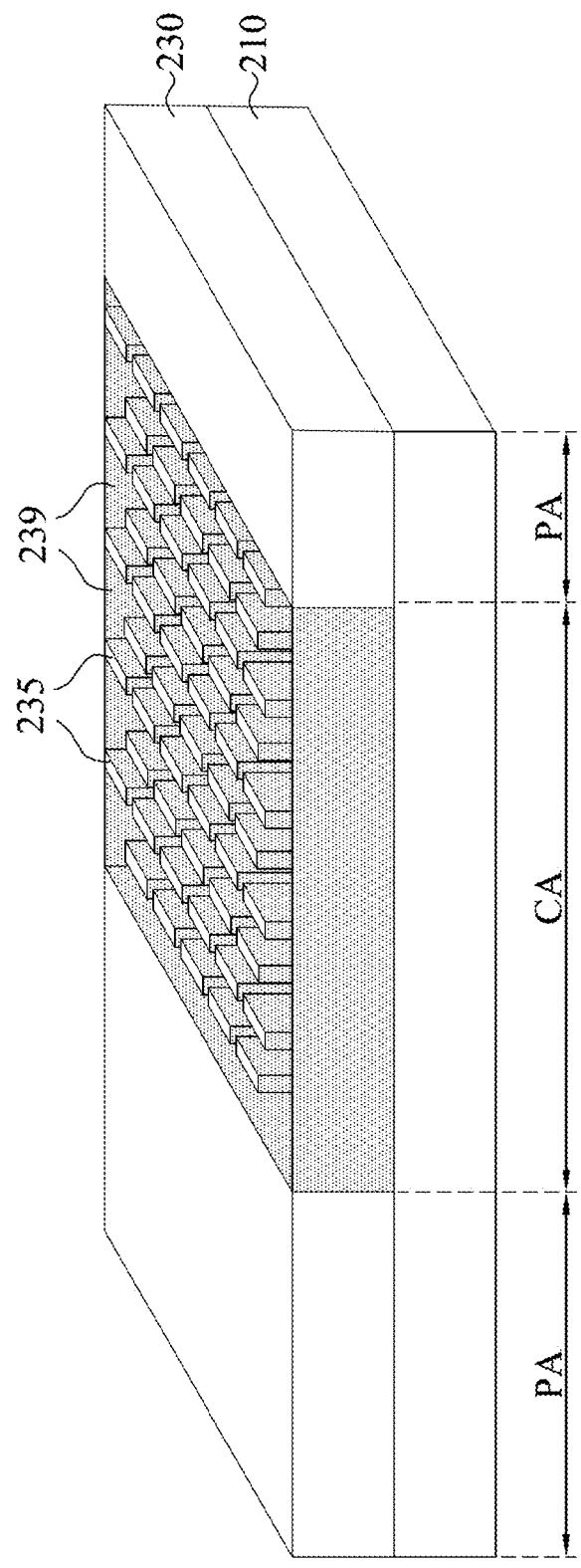

Reference is made to FIG. 6 and FIG. 7. FIG. 6 and FIG. 7 can diagrammatically illustrate Step 106 in FIG. 1. In embodiments of the present disclosure, the method 100 for forming a semiconductor structure further includes Step 106 in which an isolation structure 239 is grown in the trench 237. The isolation structure 239 surrounds the segment fin features 235 to form shallow trench isolation (STI) among the segment fin features 235. Thereafter, the method 100 continues with Step 107 in which a polish treatment such as a chemical mechanical polishing (CMP) treatment is performed to the isolation structure 239, and top surfaces of the segment fin features 235 are exposed. Thus, a semiconductor structure 200 which includes segment fin features 235 without edge imbalance is formed, and the semiconductor structure further includes the isolation structure 239 surrounding and exposing the segment fin features 235.

Figure 8:
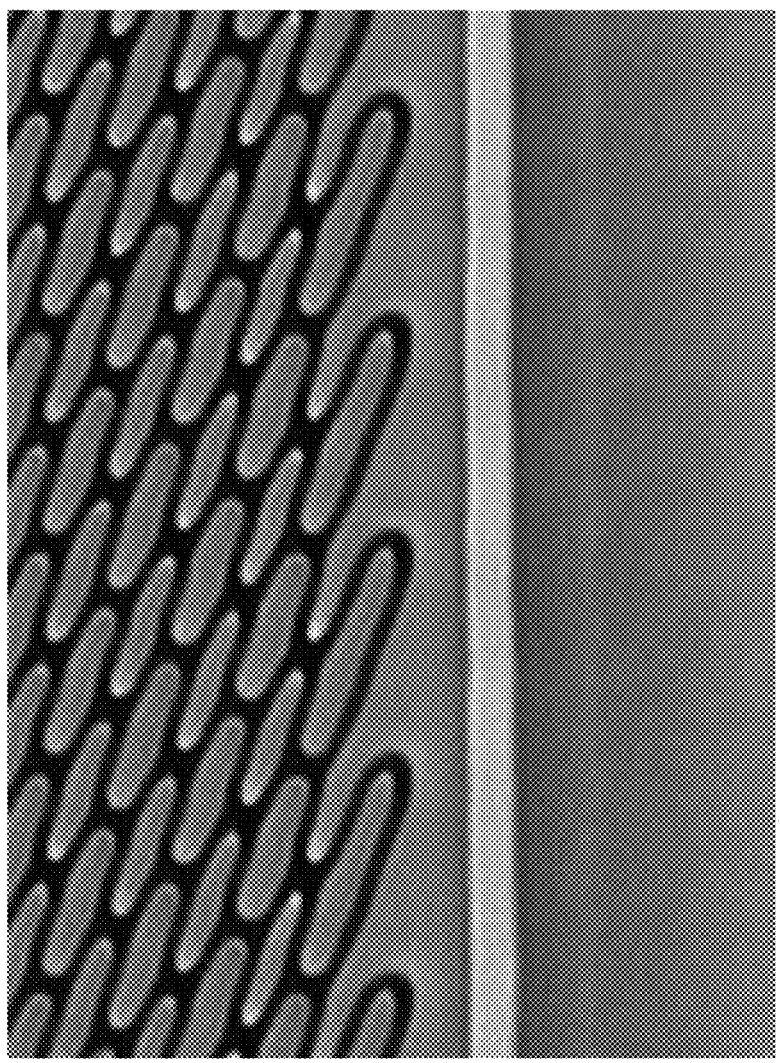
FIG. 8 is a photo illustrating a top view of a semiconductor structure not using the method of embodiments in the present disclosure.
Figure 9:
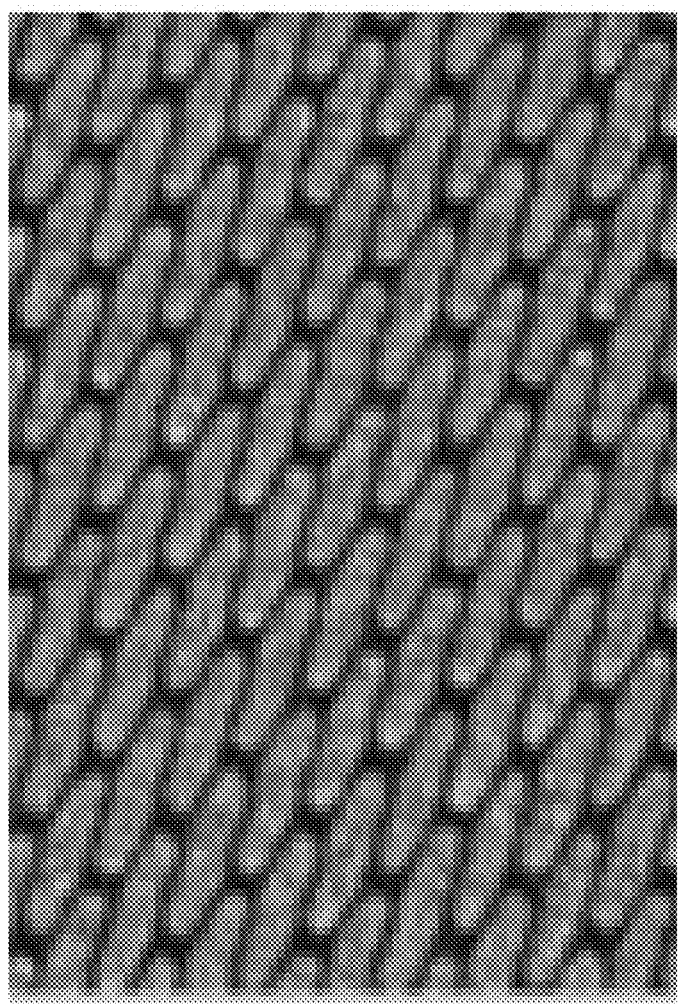
FIG. 9 is a photo illustrating a top view of a semiconductor structure formed by the method in accordance with some embodiments of the present disclosure.

Reference is made to FIG. 8 and FIG. 9. FIG. 8 is a photo of a semiconductor structure having segment fin features and not using the method 100 in FIG. 1. FIG. 9 is a photo of a semiconductor structure formed by the method 100 in FIG. 1 according to some embodiments of the present disclosure. As shown in FIG. 8, some segment fin features are not uniform at the edge of the semiconductor structure. FIG. 9 shows uniform segment fin features are well modified, and thus a better semiconductor structure is formed by conducting the method 100.

In summary, the present disclosure provides a method of forming a semiconductor structure in which edge imbalances caused by photo loading effect and etch loading effect can be avoided, and thus uniform linear fin features are obtained. Thereafter, the uniform linear fin features are etched to form segment fin features. Since edge imbalance portions of the linear fin features are removed, the high qualitied segment fin features are obtained.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for forming a semiconductor structure comprising:
    providing a substrate and a target layer disposed on the substrate, and the target layer comprises a central area and a periphery area;
    forming a plurality of linear fin features within the central area, wherein the linear fin features are substantially parallel to each other and comprise edge imbalance portions, wherein each linear fin feature comprises a uniform portion, and each imbalance portion has a width lager than that of the uniform portion; and
    removing the edge imbalance portions of the linear fin features to obtain linear uniform fin features.

2. The method of claim 1, further comprising forming a hard mask between the substrate and the target layer.

3. The method of claim 1, wherein the target layer includes SiN.

4. The method of claim 1, wherein forming the linear fin features in the central area comprises performing a first litho-etch process to the central area of the target layer.

5. The method of claim 1, wherein removing the edge imbalance portions of the linear fin features to obtain linear uniform fin features comprises:
    forming a patterned photoresist layer to cover the target layer, wherein the patterned photoresist layer comprises an opening which exposes the edge imbalance portions of the linear fin features;
    removing the edge imbalance portions; and
    removing the patterned photoresist layer.

6. The method of claim 5, wherein the opening has a width ranging from about 100 nm to about 1 µm.

7. The method of claim 1, further comprising:
    etching the linear uniform fin features such that each linear uniform fin feature is divided into segment fin features, and abutting two of the segment fin features are spaced apart by a trench.

8. The method of claim 7, further comprising growing an isolation structure in the trench.

9. The method of claim 8, further comprising performing a polish treatment to the isolation structure to expose the segment fin features.

10. The method of claim 7, wherein etching the linear uniform fin features such that each linear uniform fin feature is divided into segment fin features comprises:
    performing a second litho-etch process to each linear uniform fin feature to obtain the segment fin features.

* * * * *